United States Patent [19]

Piercy et al.

[11] Patent Number: 4,868,513
[45] Date of Patent: Sep. 19, 1989

[54] PHASE-LOCKED LOOP WITH REDUNDANT REFERENCE INPUT

[75] Inventors: John R. Piercy; Miroslaw Grzeszykowski, both of Mississauga, Canada

[73] Assignee: Amdahl Corporation, Sunnyvale, Calif.

[21] Appl. No.: 344,413

[22] Filed: Apr. 25, 1989

Related U.S. Application Data

[63] Continuation of Ser. No. 95,811, Sep. 11, 1987, abandoned.

[51] Int. Cl.$^4$ .......................... H03K 9/06; H03L 7/00
[52] U.S. Cl. .................................... 328/134; 328/155; 331/1 A; 331/25; 307/262; 307/511
[58] Field of Search ............... 328/133, 134, 137, 154, 328/155; 307/511, 262; 331/1 R, 1 A, 10, 11, 12, 18, 25

[56] References Cited

U.S. PATENT DOCUMENTS

| | | | |
|---|---|---|---|
| 3,555,194 | 1/1971 | Goto | 331/12 |
| 3,571,743 | 3/1971 | Menkes | 331/11 |
| 3,684,976 | 8/1972 | Terreault | 331/10 |
| 4,166,984 | 9/1979 | Jenkins | 331/1 A |
| 4,511,859 | 4/1985 | Dombrowski | 331/11 |
| 4,563,767 | 1/1986 | Brandt | 331/11 |
| 4,772,852 | 9/1988 | Viti | 328/133 |

Primary Examiner—Stanley D. Miller
Assistant Examiner—Timothy P. Callahan
Attorney, Agent, or Firm—Fliesler, Dubb, Meyer & Lovejoy

[57] ABSTRACT

A phase-locked loop with redundant reference input signals compares each reference input signal to the loop feedback signal to generate corresponding phase correction signals. In response to a reference select signal, one of the phase correction signals is selected for supply as a loop correction signal. The loop correction signal is supplied through a filter as a control signal to a VCO. Phase and frequency detectors are included, each detector receiving a corresponding reference input signal and connected to receive the loop feedback signal for generating a phase correction signal indicating the phase and frequency difference between the corresponding reference input signals and the output signal. Also, a selector is provided in communication with each of the detectors that selects one of the phase correction signals in response to the reference select signal as the loop correction signal. Further a phase alignment circuit is used with phase and frequency detectors to assure tracking of the correct edge of the reference signal by each unselected phase and frequency detector.

14 Claims, 4 Drawing Sheets

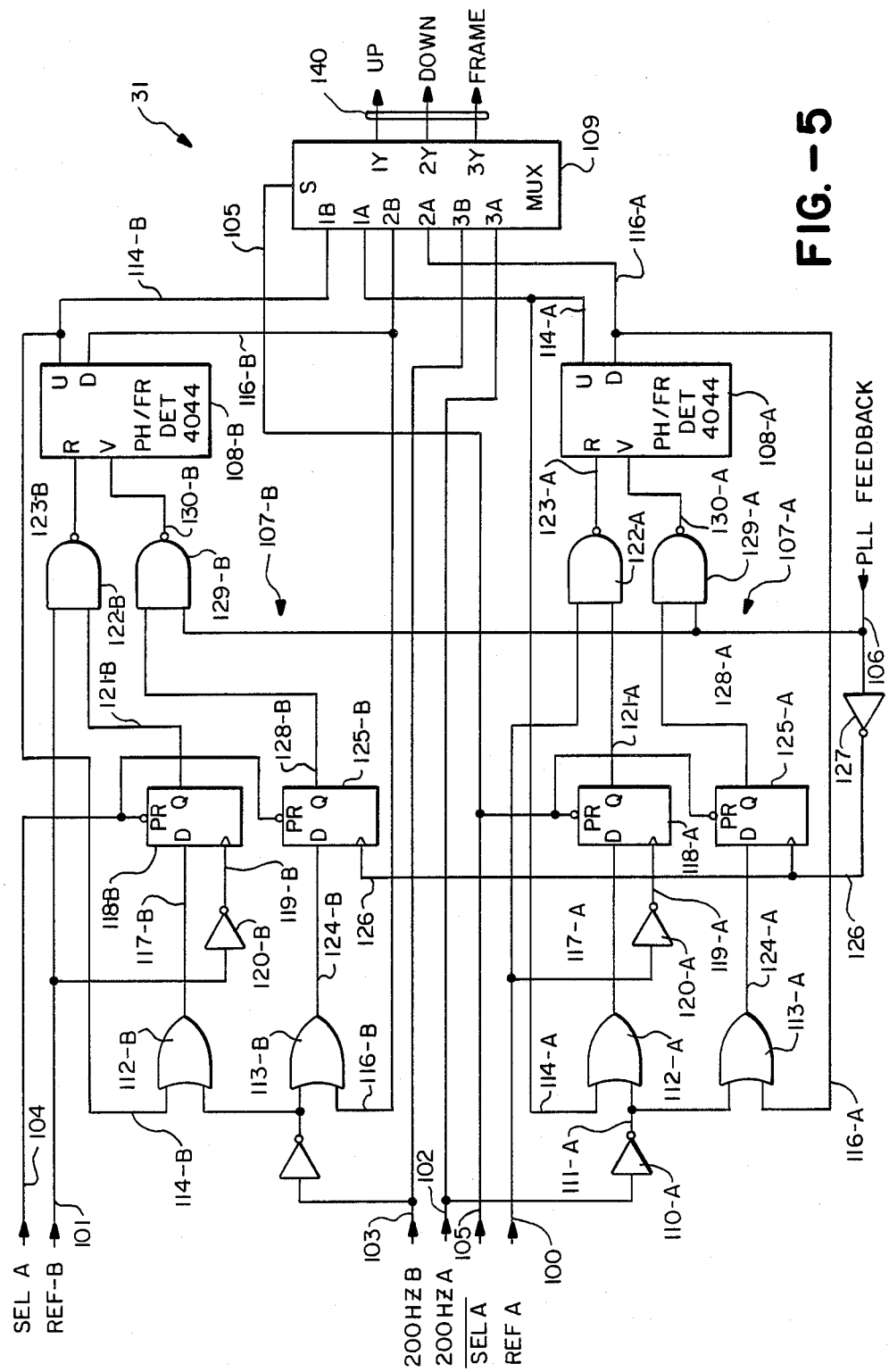
FIG. —5

PHASE-LOCKED LOOP WITH REDUNDANT REFERENCE INPUT

The present application is a continuation of Ser. No. 07,095,811 filed Sept. 11, 1987.

BACKGROUND OF THE INVENTION

1. Field of the Invention

The present invention relates to phase-locked loop systems which provide for selection between two or more reference signals for input, to the phase-locked loop.

2. Description of Related Art

A phase-locked loop circuit operates to provide an output signal that is synchronized in phase with a reference input signal. In systems requiring high reliability, such as systems providing network synchronization in communication networks that transmit time-multiplexed data, it is desirable to have a phase-locked loop with redundant reference inputs. In case the controlling reference input suffers a fault, the loop can be switched to one of the redundant inputs to reduce the impact of the reference input fault.

The process of switching from one reference input to another must be carried out without losing lock condition in the phase-locked loop. In the prior art there have been two topologies which could support more than one reference input. The first such prior art topology is shown in FIG. 1 and the second such prior art topology is shown in FIG. 2.

The topology shown in FIG. 1 relies on the use of an input signal selector 10 to select one of the redundant reference inputs, REF1, REF2, . . . REFM, to provide a single reference input on line 11 for the phase-locked loop. As is typical in the art, the phase-locked loop includes a phase detector 12 which supplies a phase error signal on line 13 to a filter 14. The output of the filter is a control signal on line 15. A voltage-controlled oscillator 16 receives the control signal and generates an output signal on line 17. The output signal is fed back through a feedback path which typically includes a frequency divider 18. The output of the frequency divider is a phase-locked loop feedback signal on line 19, which is supplied to the phase detector 12.

In the topology of FIG. 1, in order to provide a loss-of-lock free switching between inputs, some restrictions on the type of components used in the loop are created. In particular, due to switching glitches that occur at the output of the selector 10 during switching from one reference input to another, the phase detector 12 must be a "phase only" type detector. It cannot be a phase and frequency type detector as explained below.

A phase-only detector operates by measuring the phase difference between the closest pair of rising edges, or falling edges, in the reference input signal and the loop feedback signal within a range of 180 degrees. The phase only detector can allow false locks in specific ratios of the reference signal, such as the major harmonic frequencies; therefore, the VCO must have a narrow bandwidth to eliminate the possibility of locking up at one of the false lock frequencies. The phase and frequency detector, on the other hand, is a state machine that generates an output based on the history of rising edges, or falling edges. In particular, it generates an output based on a set of rising edges within a range of 360 degrees that is determined by the history of the signals. Because the phase and frequency detector does not suffer the possibility of a false lock, one can use a wider bandwidth VCO in the phase-locked loop.

By using a phase-only type detector in the topology of FIG. 1, the designer is assured that any switching glitches cause only minor perturbation in the signal entering the filter 14, and can thus be sufficiently filtered so that the control signal on line 15 does not swing in an amount that would cause a loss of lock condition.

The use of only phase detection, however, can cause a problem with "false" lock conditions if the VCO 16 has a wide operating frequency range. To prevent false locks, the VCO must have a narrow frequency range to the point where only one stable operating frequency occurs. This stable operating frequency must correspond to the "lock" frequency expected to be reached by the phase-locked loop. Thus, a more stable, and more expensive variety of VCO must be used. Phase-locked loops of this topology having a wide frequency range can be implemented; however, the VCO must be designed so that it operates in a number of selectable narrow sub-ranges to provide the wide range. This further increases the complexity and cost of the apparatus.

FIG. 2 illustrates the second prior art topology. In this apparatus, a separate phase-locked loop is used for each reference input, and selection between reference inputs is provided by selecting from the output of redundant phase-locked loops. Thus, as can be seen in FIG. 2, the first reference input REF1 is supplied as a input to a first phase-locked loop 20. Subsequent reference inputs such as REFM, are each supplied to a separate phase-locked loop 21. The output of the phase-locked loop 20 on line 22 is supplied as a first input to a selector 23. The output of the phase-locked loop 21 on line 24 is supplied as an Mth input to the selector 23. The reference select signal on line 25 controls the selector to provide on an output line 26, the active output signal.

The topology of FIG. 2 suffers from being hard-ware intensive, requiring as many phase-locked loop circuits as there are reference inputs. The complexity of the circuit is further increased by the design of the selector 23. The action of the selector must be synchronized with the selected signal so that switching glitches do not occur on the output line 26 which can cause system synchronization problems for the apparatus relying on that signal.

The topology of FIG. 2 does overcome the requirement for use of expensive VCOs by eliminating switching glitches prior to the phase detector. Thus the phase detector can be implemented as a phase and frequency detector that prevents the false lock condition.

It is desirable to provide a phase-locked loop that accepts two or more reference inputs and has the following features:

(1) provides for a selection between reference inputs without losing lock when the reference signals are substantially phase-synchronized, such as when generated by a common source.

(2) operates over a wide frequency range without danger of false locks.

(3) employs low complexity circuitry that can be implemented with low cost components, especially a low stability, inexpensive VCO chip.

SUMMARY OF THE INVENTION

The present invention provides an apparatus for generating an output signal synchronized with a selected one of a plurality of reference input signals as indicated by a reference select signal. The apparatus comprises a means, receiving a loop feedback signal, each of the plurality reference input signals and the reference select signal, for comparing each reference input signal in the plurality to the loop feedback signal to generate a corresponding plurality of phase correction signals. In response to the reference select signal, one of the plurality of phase corrections signals is selected for supply as a loop correction signal. The loop correction signal is supplied to a filter that generates a control signal. The control signal is supplied to a voltage controlled oscillator that generates the output signal. The output signal is supplied through a feedback path providing the loop feedback signal.

The means for comparing and selecting includes a plurality of detectors, each receiving a corresponding reference input signal and connected to receive the loop feedback signal for generating a phase correction signal indicating the phase and frequency difference between the corresponding reference input signal and the output signal. Also, a selector is provided in communication with each of the detectors that selects one of the phase correction signals in response to the reference select signal as the loop correction signal.

In another aspect, each one of the detectors includes an alignment means, connected to receive an align signal, the phase correction signal generated by the detector, the corresponding reference signal and the loop feedback signal. At timing intervals indicated by the align signal, the corresponding reference input signal and the output feedback signal are aligned to minimize the magnitude of the phase correction signal. Further, a means is provided for disabling the alignment means when the corresponding phase correction signal is selected as a loop correction signal. By virtue of the detecting and selecting circuitry of the present invention, an improved phase-locked loop system is provided that overcomes many of the problems of the prior art.

BRIEF DESCRIPTION OF THE DRAWINGS

FIG. 5 is a logic diagram of the redundant phase and frequency detector and selector according to the preferred embodiment.

DESCRIPTION OF THE PREFERRED EMBODIMENT

Figure 1:
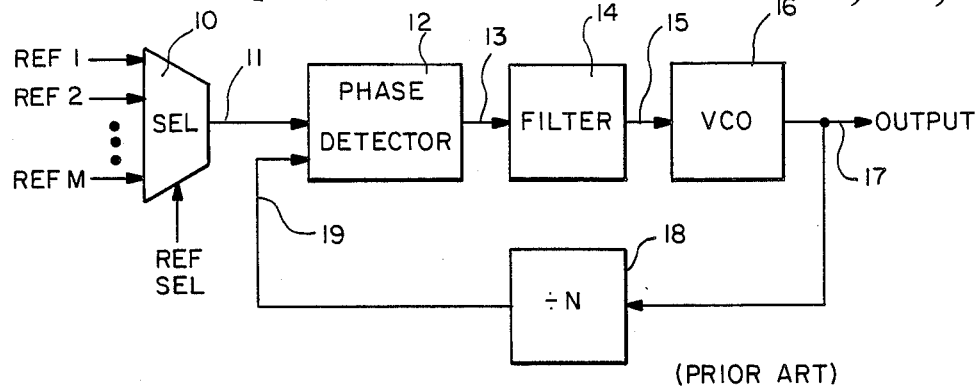
FIG. 1 is a block diagram of a prior art phase-locked loop receiving one of a plurality of reference input signals.
Figure 2:
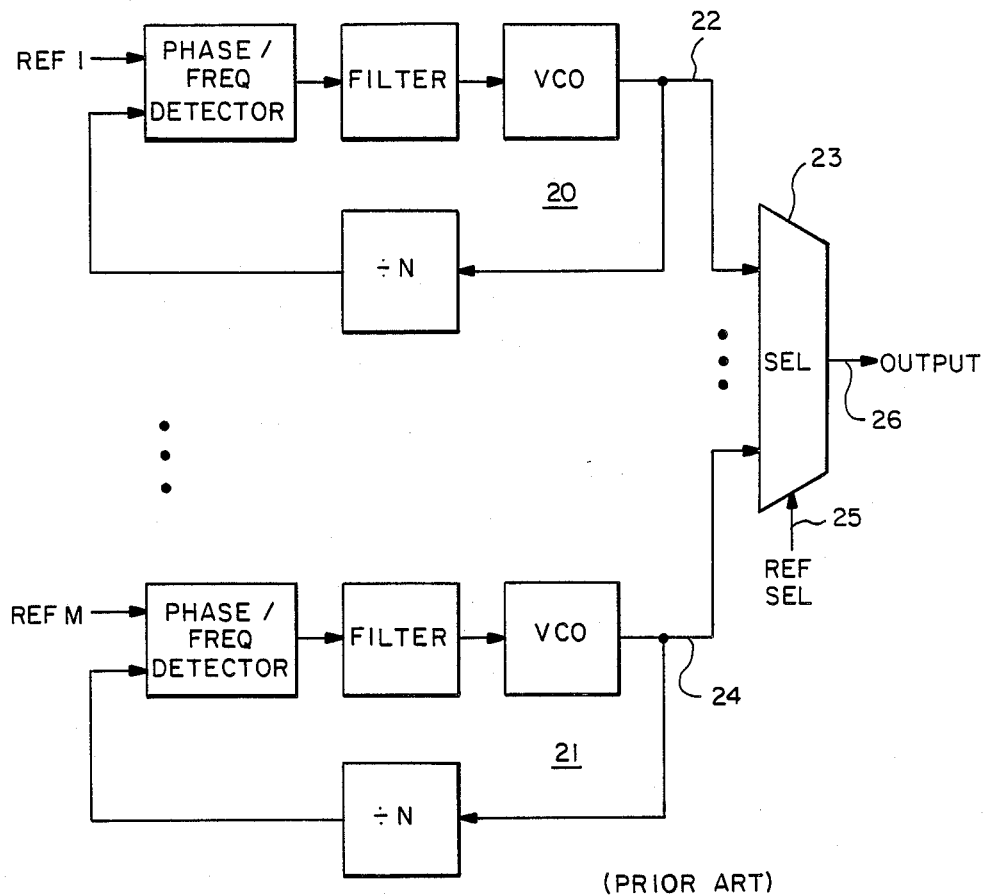
FIG. 2 is a block diagram for a prior art system including a plurality of phase-locked loops, each receiving an independent reference signal with means for selecting the output of one of the plurality of phase-locked loops.
Figure 3:
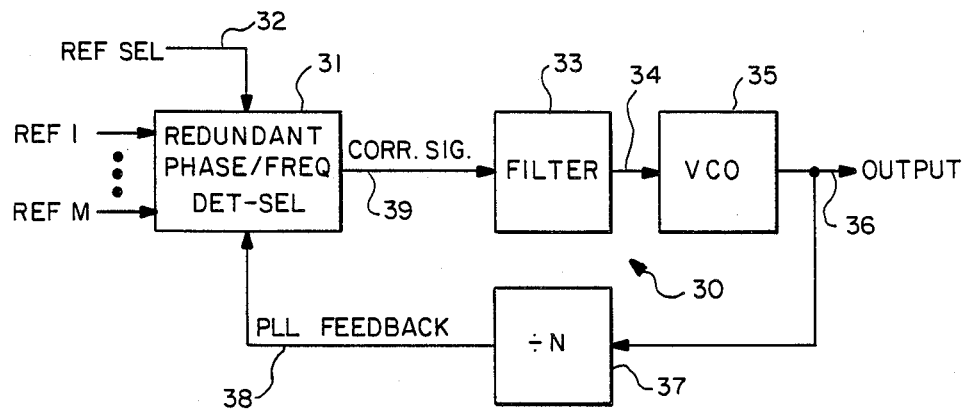
FIG. 3 is a block diagram of the present invention.

With reference to FIGS. 3, 4, 5, 6A and 6B, the preferred embodiment is described. FIG. 3 is a block diagram of a phase-locked loop implementing the present invention. The phase-locked loop 30 of FIG. 3 is adapted to receive a plurality of redundant reference input signals, REF1, . . . REFM, at a redundant phase and frequency detector and selector 31. The phase and frequency detector and selector 31 also receives a reference select signal on line 32. The output of the phase and frequency detector and selector 31 is a loop correction signal on line 39 which is supplied to a filter 33. The output of the filter is a control signal on line 34 which is supplied to a voltage-controlled oscillator 35. The output of the voltage-controlled oscillator 35 is supplied on line 36 for use, for instance, in providing network synchronization for a communication system. The output on line 36 is supplied through a feedback path that includes a divider 37. The output of the divider 37 is a phase-locked loop feedback signal on line 38 which is provided to the redundant phase and frequency detector and selector 31.

Figure 4:
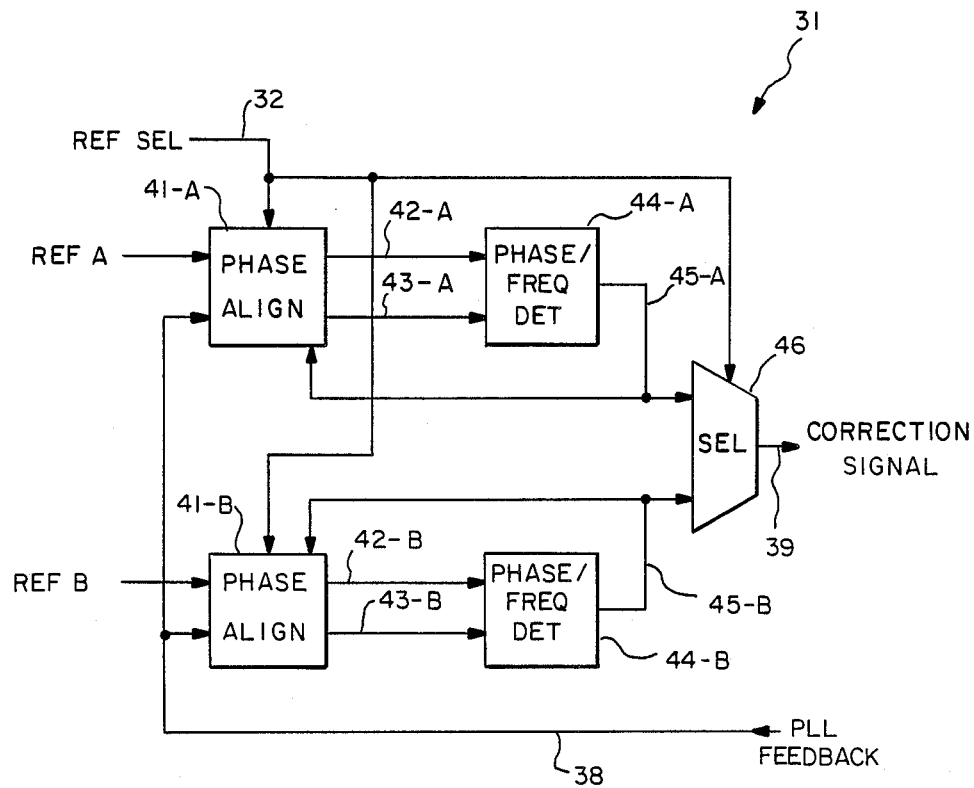
FIG. 4 is a block diagram of the redundant phase and frequency detector and selector according to the present invention.

The redundant phase and frequency detector and selector 31 provides a means for comparing each reference input signal in the plurality to the loop feedback signal to generate a corresponding plurality of phase correction signals and for selecting in response to the reference select signal, one of the phase correction signals for supply as a loop correction signal on line 39. A functional block diagram of the redundant phase and frequency detector and selector 31 that is adapted to receive two reference inputs, REF-A and REF-B, is shown in FIG. 4. As mentioned above, the reference select signal on line 32 is supplied as one input and the phase-locked loop feedback signal on line 38 is supplied as another input. The plurality of reference signals, REF-A and REF-B are supplied as inputs to corresponding phase-align circuits 41-A and 41-B. A second input to the phase-align circuits 41-A and 41-B includes the phase-locked loop feedback signal on line 38. The first output of the phase-align circuits 41-A, 41-B is the signal on line 42-A and 42-B providing the corresponding reference input. The second output of the phase-align circuits 41-A and 41-B is a signal on line 43-A, 43-B that provides the phase-locked loop feedback signal as operated on by the align circuit 41-A, 41-B. The signals on line 42-A and 43-A are supplied to a phase and frequency detector 44-A. The signals on line 42-B and 43-B are supplied to a corresponding phase and frequency detector 44-B. The output of the phase and frequency detector 44-A is a phase correction signal on line 45-A indicating the phase and frequency difference between REF-A and the phase-locked loop feedback signal. Likewise, the output of the phase and frequency detector 44-B is a signal on line 45-B that indicates the phase and frequency difference between the phase-locked loop feedback signal and REF-B.

The phase-align circuits 41-A and 41-B each receive the reference select signal on line 39. In addition, the phase-align circuit 41-A receives the phase correction signal on line 45-A, and the phase align circuit 41-B. receives the phase correction signal on line 45-B.

The phase correction signals 45-A and 45-B are supplied as inputs to a selector 46. The reference select signal on line 32 controls the selector to provide a loop correction signal on line 39.

The phase-align circuits 41-A and 41-B provide a means for aligning the corresponding reference input signal and the phase-locked loop feedback signal to minimize the magnitude of the phase correction signal. This alignment function operates to keep the phase correction signals on lines 45-A and 45-B close. This is important in circuits utilizing phase and frequency detectors 44-A, 44-B because even though reference A and reference B may be essentially synchronized, coming from the same source, the phase and frequency detector may be generating the correction signal based on a different set of edges for each reference signal. The phase alignment apparatus 41-A, 41-B operate to assure that the same sets of edges are being compared by both detectors 44-A, 44-B.

The reference select signal on line 32 is supplied to the phase align circuit 41-A, 41-B to provide an enable signal. Thus, the phase-align circuits 41-A, 41-B are enabled only when their corresponding reference input signals are not selected as a loop reference signal, so that the phase-align circuits 41-A, 41-B do not cause glitches in the loop correction signal being used by the phase-locked loop.

FIG. 5 is a circuit diagram illustrating the preferred embodiment of the redundant phase and frequency detector and selector 31. In the embodiment shown in FIG. 5, the redundant reference input signals include REF-A on line 100 and REF-B on line 101. REF-A and REF-B are 8 kHz signals generated from a common source so that they remain substantially synchronized. Accompanying each reference input signal is a 200 Hz framing signal, 200 HZA on line 102 and 200 HZB on line 103. These signals generate a pulse every 40 cycles of the corresponding reference signal that remains high for one entire cycle of its corresponding reference signal.

The reference select signal is provided in a true and complemented form on lines 104 and 105, respectively. When the signal on line 105 is asserted active low, $\overline{SELA}$, the apparatus works to select reference input A on line 100. When it is not asserted, reference B on line 101 is selected.

The phase-locked loop feedback signal is supplied on line 106 in the form of an 8 kHz signal having a phase equal to the phase of the output of the phase-locked loop.

As illustrated in FIG. 4, the redundant reference input phase and frequency detector and selector 31 includes the phase-align circuit 107-A, 107-B, and the phase and frequency detector 108-A, 108-B. In addition, a multiplexer 109 is provided corresponding to the selector 46 as shown in FIG. 4.

The circuit is divided into a first half that is responsive to REF-A on line 100 and a second half that is responsive to REF-B on line 101. Thus, the numbering of the components will follow the -A, -B format to indicate on which half of the circuit it resides. Only the half of the circuit that services REF-A will be described in detail, because the REF-B half is substantially identical and given the same reference numeral with a -B suffix. Differences between the halves are identified.

The reference REF-A half of the circuit shown in FIG. 5 receives the 200 HZA signal on line 102 at inverter 110-A (the inverter 110-B receives the 200 HZB signal on line 103). The output of the inverter 110-A is supplied on line 111-A as a first input to OR-gate 112-A and as a first input to OR-gate 113-A. The second input to the OR-gate 112-A is the U output of the phase and frequency detector 108-A on line 114-A. The second input to the OR-gate 113-A is the D output of the phase and frequency detector 108-A on line 116-A.

The output of the OR-gate 112-A is supplied on line 117-A as the D input to a flip-flop 118-A. The flip-flop 118-A is clocked by a signal on line 119-A at the output of inverter 120-A. The input to the inverter 120-A is the REF-A signal on line 100. The Q output of the flip-flop 118-A is supplied on line 121-A as a first input to NAND-gate 122-A. The second input to NAND-gate 122-A is the REF-A signal on line 100. The output of NAND-gate 122-A is supplied on line 123-A as the R input to the phase and frequency detector 108-A.

The output of the OR-gate 113-A is supplied on line 124-A as the D input to flip-flop 125-A. Flip-flop 125-A is clocked by signal on line 126 at the output of inverter 127. The input to inverter 127 is the phase-locked loop feedback signal on line 106. The signal on line 126 is also supplied to the B-half of the circuit to clock flip-flop 125-B.

The output of the flip-flop 125-A is supplied on line 128-A as a first input to NAND-gate 129-A. The second input to NAND-gate 129-A is the phase-locked loop feedback signal on line 106. The output of the NAND-gate on line 130-A is supplied as the V-input to the phase and frequency detector 108-A.

The $\overline{SELA}$ signal on line 105 is supplied as the preset input active low to the flip-flops 118-A and 125-A. The SELA signal on line 104 is supplied as the preset input active low to flip-flops 118-B and 125-B.

The output of the phase and frequency detector 108-A includes the U-signal on line 114-A and the D-signal on line 116-A. The U-signal is normally high and goes low when the set of edges selected by the phase and frequency detector includes an R-signal which precedes the V-signal and only for the duration of time that the R-signal precedes the V-signal. Likewise, the D-signal on line 116 is normally high and goes low for a set of edges in which the V signal precedes the R signal and only for the period of time that the V signal precedes the R signal. The combination of the signals on line 114-A and 116-A comprises the phase correction signal corresponding to the reference input REF-A. Likewise, the signals 114-B and 116-B together make up the phase correction signal corresponding to REF-B.

The multiplexer 109 receives the $\overline{SELA}$ signal on line 105 at its select input. It includes three A inputs and three B inputs. The three A inputs receive, respectively, the signal on line 114-A, the signal on line 116-A and the 200 HZA signal on line 102. The three B inputs receive the signal on line 114-B, the signal on line 116-B and the 200 HZB signal on line 103. When the $\overline{SELA}$ signal on line 105 is low, signals 114-A and 116-A are selected as a loop correction signal on line 140.

The phase and frequency detectors 108-A, 108-B are implemented in the preferred embodiment with the Motorola MC4044 phase-frequency detector. Details concerning the operation of this part can be obtained from Motorola in part specifications. The multiplexer 109 is implemented using a 74HC157 or equivalent multiplexer. Other elements of the circuit shown in FIG. 5 can comprise any standard elements known in the art.

The connection of the parts shown in FIG. 5 is provided for the purpose of illustrating the present invention. Other elements of the circuit such as lo power supply grounding pins, pull-up resistors and the like are not shown for the purpose of clarity of the description.

In Operation

As indicated above, the reference input signal such as REF-A and the phase-locked loop feedback signals are supplied to the phase detectors 108, through NAND-gates 122 and 129. The NAND-gates provide a means for enabling supply of the reference signal and loop signal to the phase and frequency detector. The other inputs to the NAND-gates 123, 129 are enable signals at the output of the flip-flops 118, 125. These enable signals are normally high, enabling supply of the corresponding reference signal and the loop feedback signal in an inverted form through the NAND-gates unless for the corresponding reference input signal the U output on line 114 indicates that the R input precedes the V input by more than a preselected threshold, (or the D output indicates that the V input precedes the R input by more than a preselected threshold), and the corresponding phase correction signal is not selected as the loop correction signal. In the implementation described, the enable signal on line 121 and 128 is lowered for one cycle, resulting in a stealing of one cycle of corresponding reference input or loop feedback signal in order to allow alignment to minimize the magnitude of the phase correction signals on line 114, 116.

The preset inputs to the flip-flops 118, 125 provide a means for disabling the phase align circuit when the corresponding reference input signal is selected for supply through the multiplexer 109. Thus, when $\overline{SELA}$ on line 105 is low, the Q outputs of flip-flops 118-A and 125-A are high assuring that no cycle stealing occurs at the input of phase and frequency detector 108-A. Correspondingly, when the SELA signal on line 104 is low, the Q outputs of flip-flops 118-B and 125-B are held high assuring that no cycle stealing occurs at the input to the phase and frequency detector 108-B.

Figures 6A, 6B:
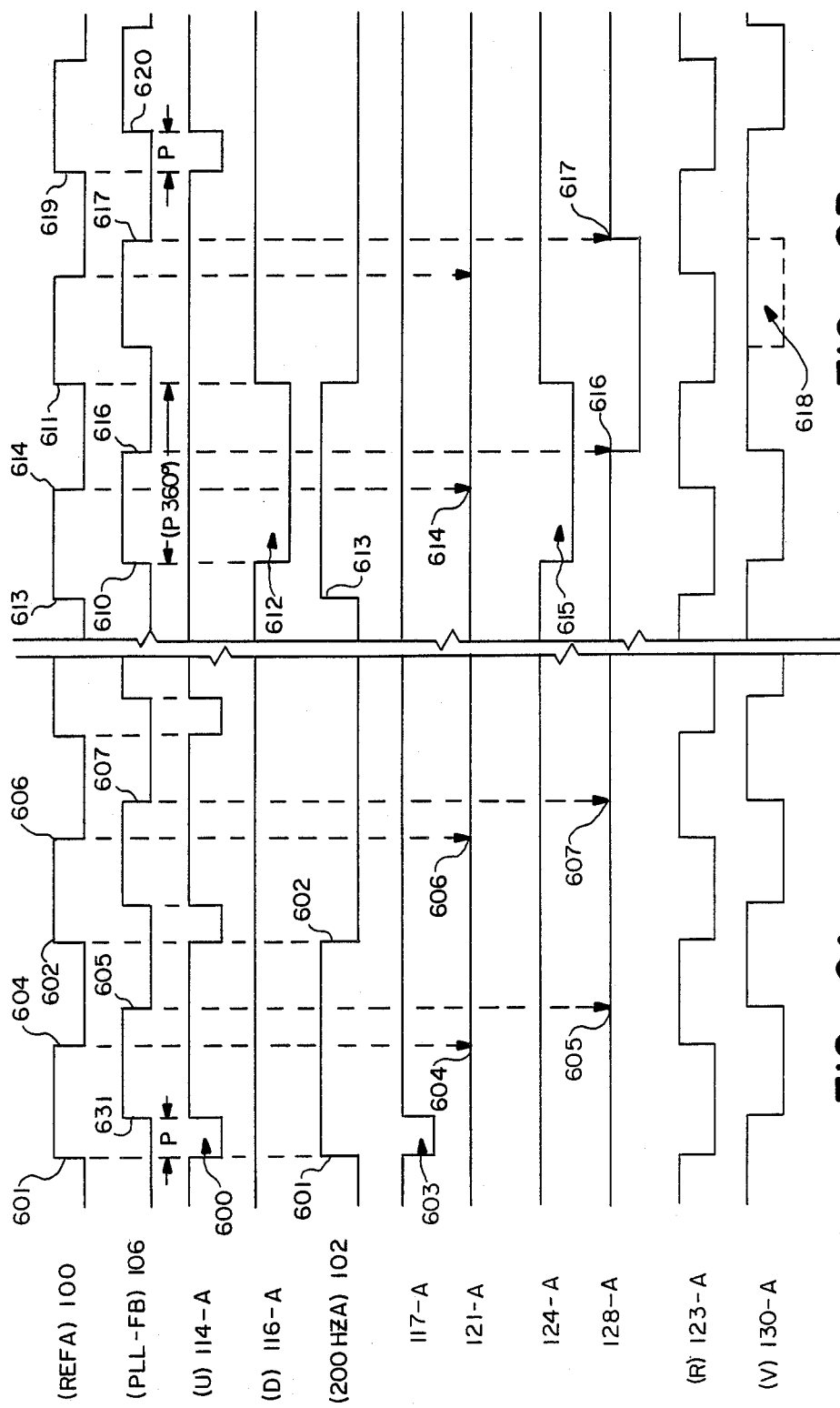
FIGS. 6A and 6B are timing diagrams used to illustrate the operation of the circuit shown in FIG. 5.

FIGS. 6A and 6B illustrate that the "cycle stealing" operation of the alignment circuits shown in FIG. 5. In FIG. 6A, no cycle stealing occurs, while in FIG. 6B, the cycle stealing operation is illustrated. In the condition shown in FIG. 6A, the rising edge 601 of REF-A precedes the rising edge 631 of the phase-locked loop feedback signal by a phase error P. Thus, the U output goes low for a time period corresponding to P at point 600. The align signal supplied by the 200 HZA signal on line 102 goes high in synchronization with the rising edge 601 of REF-A. It remains high for one full cycle of REF-A and goes low in synchronization with the next rising edge 602 of REF-A. The output of the OR-gate 112 on line 117 will go low as indicated at 603 as long as the U output is low, but will go high for the remainder of the period during which the align signal between points 601 and 602 is true (the signal on line 102 is supplied through inverter 110-A). When the flip-flop 118-A is clocked at the falling edge of REF-A at point 604, no change in the output on line 121-A occurs so that the REF-A is supplied in its inverted form at the output of NAND-gate 122-A on line 123-A as the R input to the phase and frequency detector 108-A. Likewise, when flip-flip 125 is clocked at the falling edge 605 of the phase-locked loop feedback signal, no change in its output on line 128-A occurs. Thus, no cycle stealing operation is needed during that cycle of the align signal between points 601 and 602. Upon the next rising edge 602 of the REF-A input, the align signal goes low, supplying a high input to OR-gate 112-A and 113-A assuring that the signals on line 117-A and 124-A remain high until the next occurrence of the align signal. Thus, at the falling edges of REF-A and the phase-locked loop signal at points 606 and 607, there is no change in the output of the flip-flops and the REF-A and loop feedback signals are enabled.

FIG. 6B illustrates the opposite condition where a cycle stealing operation is needed so that realignment of the REF-A and loop feedback signals occurs. In the condition of FIG. 6B, the set of rising edges being compared by the phase and frequency detector include the rising edge 610 of the phase-locked loop feedback and the rising edge 611 of the REF-A signal. Thus, the phase difference being detected is P-360 degrees. This results in the D output of the phase and frequency detector on line 116-A going low from the point 610 to the point 611 as indicated at 612. Upon the occurrence of the align signal synchronized with the rising edge 613 of the reference input signal, the phase alignment circuit is enabled. The signal on line 117-A is not affected because the U output on line 114-A remains high. Thus, when the flip-flop 118 is clocked at the falling edge 614 of the REF-A signal, no change in the output of the flip-flop occurs. However, the signal on line 124-A at the output of OR-gate 113-A will go low, passing the D signal through during the align interval as indicated at 615. When the flip-flop 125 is clocked at the falling edge 616 of the loop feedback signal, the Q output on line 128-A goes low which disables the NAND-gate 129-A. This flip-flop will not be clocked again until one full cycle of the loop feedback signal at point 617. Thus, a cycle of the V input on line 130-A to the phase-frequency detectOr 108-A will be "stolen" as indicated by the dotted lines at point 618. This condition causes the phase and frequency detector to change state so that the set of rising edges being compared, switches. Thus, the rising edge of 619 of the REF-A signal is compared with the following rising edge 610 of the loop feedback signal. This causes the U output of the phase and frequency detector on line 114-A to go low to indicate a phase error of P. It can be seen that the magnitude of the phase correction signal has been minimized by this cycle stealing operation. Further, it assures that the phase correction signal generated by the nonactive loop reference signal is as close as possible to the phase correction signal generated in the active loop reference signal, and reduces errors due to drift of the reference signals.

The complementary function can occur when the U signal indicates a phase error of more than one-half cycle of the REF-A input.

The preselected thresholds at which the phase alignment occurs in the preferred embodiment is one-half cycle of the REF-A signal for a phase error indicated by the U output on line 114, and one-half cycle of the phase-locked loop feedback signal for errors indicated by the D output on line 116-A. Thus, for any phase error of more than 180 degrees in the preferred embodiment, a cycle stealing operation is carried out to change the state of the phase and frequency detector so that the minimum phase error magnitude is indicated.

Conclusion

A phase-locked loop system adapted to receive redundant reference input signals has been disclosed, that improves significantly over prior art systems. The phase of each reference input signal and the phase of the phase-locked loop feedback signal are compared to generate an independent phase error signal corresponding to each reference input signal. A signal selector is placed between the phase and frequency detectors and the phase-locked loop filter so that the output of the detector receiving the reference input to be selected is supplied to the phase-locked loop. Further, a phase alignment circuit is used with phase and frequency detectors to assure tracking of the correct edge of the reference signal by each unselected phase and frequency detector.

According to this invention, a redundant reference input phase-locked loop has been implemented with high reliability and minimizing the component cost and reducing output glitches due to reference signal switching.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

We claim:

1. An apparatus for generating an output signal synchronized with a selected one of a plurality of reference input signals as indicated by a reference select signal, comprising:

means, connected to receive a loop feedback signal, each of the plurality of reference input signals and the reference select signal, for comparing each reference input signal in the plurality to the loop feedback signal to generate a corresponding plurality of phase correction signals and for selecting, in response to the reference select signal, one of the phase correction signals for supply as loop correction signal;

filter means, connected to receive the loop correction signal, for filtering the loop correction signal to generate a control signal;

generating means, connected to receive and responsive to the control signal, for generating the output signal;

feedback means, connected to receive the output signal, for supplying the loop feedback signal; and means, coupled with the means for comparing and selecting, for aligning all of the plurality of phase correction signals except for the one selected as the loop correction signal, with the loop feedback signal to minimize the magnitude of the phase correction signals not selected.

2. The apparatus of claim 1, wherein the comparing and selecting means includes:

a plurality of detector means, each having inputs connected to receive a corresponding reference input signal and the loop feedback signal, for generating a plurality of phase correction signals indicating the phase and frequency difference between the corresponding reference input signals and the loop feedback signal; and selector means, in communication with each detector means and connected to receive the reference select signal, for selecting, in response to the reference select signal, one of the plurality of phase correction signals as the loop correction signal.

3. The apparatus of claim 2, wherein the means for aligning includes in each one of the plurality of detector means;

alignment means, connected to receive one of the plurality of phase correction signals, the reference input signal corresponding to the one phase correction signal and the loop feedback signal, for aligning the reference input signal received by the alignment means and the loop feedback signal to minimize the magnitude of the one phase correction signal.

4. The apparatus of claim 3, wherein each of the alignment means further includes:

means, connected to receive the reference select signal, for disabling the alignment means when the phase correction signal received by the alignment means is selected as the loop correction signal.

5. The apparatus of claim 2, wherein at least one of the plurality of detector means includes:

phase and frequency detecting means, having a first input connected to receive a first signal and a second input connected to receive a second signal, for generating a phase correction signal indicating the phase and frequency difference between the first signal and the second signal, the phase correction signal having a first component indicating the amount by which the first signal precedes the second signal and a second component indicating the amount by which the second signal precedes the first signal;

first enabling means, connected to receive the corresponding reference input signal and a first enable signal, for supplying the corresponding reference input signal as the first signal in response to the first enable signal; and second enabling means, connected to receive the loop feedback signal and a second enable signal, for supplying the loop feedback signal as the second signal in response to the second enable signal;

and the means for aligning includes first means, connected to receive the first component, the reference select signal and an align signal, for generating the first enable signal unless at a time interval indicated by the align signal the first component indicates that the first signal precedes the second signal by more than a first preselected threshold and the corresponding phase correction signal is not selected as the loop correction signal;

second means, connected to receive the second component, the reference select signal and the align signal, for generating the second enable signal, unless at a time interval indicated by the align signal, the second component indicates that the second signal precedes the first signal by more than a second preselected threshold and the corresponding phase correction signal is not selected as the loop correction signal; and means for supplying the align signal in preselected timing intervals.

6. The apparatus of claim 5 wherein the first preselected threshold equals one-half cycle of the corresponding reference input signal and the second preselected threshold equals one-half cycle of the loop feedback signal.

7. In a phase-locked loop apparatus generating a loop feedback signal synchronized in response to a control signal with a selected one of a plurality of redundant reference input signals as indicated by a reference select signal, an improvement comprising:

means, connected to receive the loop feedback signal, each of the plurality of reference input signals and the reference select signal, for comparing each reference input signal in the plurality to the loop feedback signal to generate a corresponding plurality of phase correction signals and for selecting, in response to the reference select signal, one of the plurality of phase correction signals for supply as the loop correction signal;

filter means, connected to receive the loop correction signal, for filtering the loop correction signal to generate the control signal; and means, coupled with the means for comparing and selecting, for aligning all of the plurality of phase correction signals except for the one selected as the loop correction signal, with the loop feedback signal to minimize the magnitude of the phase correction signals not selected.

8. The improvement of claim 7, wherein the comparing and selecting means includes:

a plurality of detector means, each having a corresponding reference input signal and connected to receive the corresponding reference input signal and the loop feedback signal; for generating a plurality of phase correction signals indicating the phase and frequency difference between the corresponding reference input signals and the loop feedback signal; and selector means, in communication with each detector means and connected to receive the reference select signal, for selecting, in response to the reference signal, one of the plurality of phase correction signals as the loop correction signal.

9. The improvement of claim 8, wherein the means for aligning includes in each one of the plurality of detector means:

alignment means, connected to receive an align signal, one of the plurality of phase correction signals, the reference input signal corresponding to the one detector means and the loop feedback signal, for aligning in response to the align signal the reference input signal received by the alignment means and the loop feedback signal to minimize the magnitude of the phase correction signal; and means for supplying the align signal in preselected timing intervals.

10. The improvement of claim 9, wherein each of the alignment means further includes:

means, connected to receive the reference select signal, for disabling the alignment means when the phase correction signal received by the alignment means is selected as the loop correction signal.

11. The improvement of claim 8, wherein at least one of the plurality of detector means includes:

phase and frequency detecting means, having a first input connected to receive a first signal and a second input connected to receive a second signal, for generating a phase correction signal indicating the phase and frequency difference between the first signal and the second signal, the phase correction signal having a first component indicating the amount by which the first signal precedes the second signal and a second component indicating the amount by which the second signal precedes the first signal;

first enabling means, connected to receive the corresponding reference input signal and a first enable signal, for supplying the corresponding reference input signal as the first signal in response to the first enable signal; and second enabling means, connected to receive the loop feedback signal and a second enable signal, for supplying the loop feedback signal as the second signal in response to the second enable signal;

and the means for aligning includes first means, connected to receive the first component, the reference select signal and an align signal, for generating the first enable signal unless at a time interval indicated by the align signal the first component indicates that the first signal precedes the second signal by more than a first preselected threshold and the corresponding phase correction signal is not selected as the loop correction signal;

second means, connected to receive the second component, the reference select signal and the align signal, for generating the second enable signal, unless at a time interval indicated by the align signal, the second component indicates that the second signal precedes the first signal by more than a second preselected threshold and the corresponding phase correction signal is not selected as the loop correction signal; and means for supplying the align signal in preselected timing intervals.

12. The improvement of claim 11, wherein the first preselected threshold equals one-half cycle of the corresponding reference input signal and the second preselected threshold equals one-half cycle of the loop feedback signal.

13. An apparatus for generating a synchronization signal synchronized with a selected one of a plurality of redundant reference input signals as indicated by a reference select signal, comprising:

a plurality of detector means for generating a plurality of phase correction signals, each detector means having a corresponding reference input signal and connected to receive the corresponding reference input signal and a loop feedback signal, each detector means including, phase and frequency detecting means, having a first input connected to receive a first signal and a second input connected to receive a second signal, for generating one of the plurality of phase correction signals indicating the phase and frequency difference between the first signal and the second signal, the one phase correction signal having a first component indicating the amount by which the first signal precedes the second signal and a second component indicating the amount by which the second signal precedes the first signal, first enabling means, connected to receive the corresponding reference input signal and a first enable signal, for supplying the corresponding reference input signal as the first signal in response to the first enable signal, second enabling means, connected to receive the loop feedback signal and a second enable signal, for supplying the loop feedback signal as the second signal in response to the second enable signal, first means, connected to receive the first component, the reference select signal and an align signal, for generating the first enable signal unless at a time interval indicated by the align signal, the first component indicates that the first signal precedes the second signal by more than a first preselected threshold and the corresponding phase correction signal is not selected as the loop correction signal, and second means, connected to receive the second component, the reference select signal and the align signal, for generating the second enable signal, unless at a time interval indicated by the align signal, the second component indicates that the second signal precedes the first signal by more than a second preselected threshold and the corresponding phase correction signal is not selected as the loop correction signal;

means for supplying the align signal in preselected timing intervals;

selector means, in communication with each one of the plurality of detector means and connected to receive the reference select signal, for selecting, in response to the reference select signal, one of the plurality of phase correction signals as the loop correction signal;

filter means, connected to receive the loop correction signal, for filtering the loop correction signal to generate a control signal;

generating means, connected to receive and responsive to the control signal, for generating the synchronization signal; and feedback means, connected to receive the synchronization signal, for supplying the loop feedback signal.

14. The apparatus of claim 13, wherein the first preselected threshold equals one-half cycle of the corresponding reference input signal and the second preselected threshold equals one-half cycle of the loop feedback signal.

* * * * *